US011664203B2

(12) United States Patent
Unno et al.

(10) Patent No.: US 11,664,203 B2
(45) Date of Patent: May 30, 2023

(54) ELECTROSTATIC-CHUCK HEATER

(71) Applicant: NGK INSULATORS, LTD., Nagoya (JP)

(72) Inventors: Yutaka Unno, Handa (JP); Reo Watanabe, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 201 days.

(21) Appl. No.: 16/901,384

(22) Filed: Jun. 15, 2020

(65) Prior Publication Data

US 2020/0312696 A1  Oct. 1, 2020

Related U.S. Application Data

(63) Continuation of application No. PCT/JP2019/005962, filed on Feb. 19, 2019.
(Continued)

(51) Int. Cl.
*H01L 21/67* (2006.01)
*H01J 37/32* (2006.01)
(Continued)

(52) U.S. Cl.
CPC .... *H01J 37/32724* (2013.01); *C23C 16/4586* (2013.01); *C23C 16/45521* (2013.01);
(Continued)

(58) Field of Classification Search
CPC ........ H01J 37/32724; H01J 2237/2007; H01J 2237/3321; C23C 16/45521;
(Continued)

(56) References Cited

U.S. PATENT DOCUMENTS 5,810,933 A    9/1998  Mountsier et al.
6,063,202 A *  5/2000  Cleary .............. C23C 16/45521
                                                    118/500
(Continued)

FOREIGN PATENT DOCUMENTS

JP   H09-232415 A1   9/1997
JP   2000-332091 A1  11/2000
(Continued)

OTHER PUBLICATIONS

English Translation of the International Preliminary Report on Patentability (Chapter I) (Application No. PCT/JP2019/005962) dated Oct. 8, 2020.
(Continued)

*Primary Examiner* — Mohammed Shamsuzzaman
(74) *Attorney, Agent, or Firm* — Burr Patent Law, PLLC

(57) ABSTRACT

An electrostatic-chuck heater is a Johnsen-Rahbek electrostatic-chuck heater and is used in a process of forming a conductive film on a wafer. The electrostatic-chuck heater includes a disc-shaped ceramic base including an electrostatic electrode and a heating resistor, and a hollow shaft attached to a side of the ceramic base that is opposite a wafer-mounting surface. A protruding ring is provided on the wafer-mounting surface and having an outside diameter smaller than a diameter of the wafer. A through-hole extends in a peripheral wall of the hollow shaft from a lower end through to an area of the wafer-mounting surface that is on an inner side with respect to the protruding ring. The through-hole allows gas to be supplied from the lower end of the hollow shaft into a below-wafer space enclosed by the wafer-mounting surface, the protruding ring, and the wafer mounted on the wafer-mounting surface.

9 Claims, 9 Drawing Sheets

Related U.S. Application Data

(60) Provisional application No. 62/647,965, filed on Mar. 26, 2018.

(51) Int. Cl.
  *C23C 16/46* (2006.01)
  *C23C 16/50* (2006.01)
  *H01L 21/683* (2006.01)
  *C23C 16/458* (2006.01)
  *C23C 16/455* (2006.01)

(52) U.S. Cl.
  CPC .............. *C23C 16/46* (2013.01); *C23C 16/50* (2013.01); *H01L 21/67103* (2013.01); *H01L 21/6833* (2013.01); *H01J 2237/2007* (2013.01); *H01J 2237/3321* (2013.01)

(58) Field of Classification Search
  CPC ..... C23C 16/4586; C23C 16/46; C23C 16/50; H01L 21/67103; H01L 21/6833; H01L 21/683; H01L 21/68785; B23Q 3/15; H02N 13/00
  See application file for complete search history.

(56) References Cited

U.S. PATENT DOCUMENTS

| | | | |
|---|---|---|---|
| 6,471,779 B1 | 10/2002 | Nishio et al. | |
| 6,494,955 B1 * | 12/2002 | Lei | H01L 21/68785 118/724 |
| 6,768,627 B1 * | 7/2004 | Kitabayashi | B23Q 3/154 361/234 |
| 2002/0159217 A1 | 10/2002 | Tsuruta et al. | |
| 2004/0218340 A1 | 11/2004 | Kitabayashi et al. | |
| 2006/0209490 A1 * | 9/2006 | Nakamura | H01L 21/6831 361/234 |
| 2009/0235866 A1 * | 9/2009 | Kataigi | H01L 21/6875 118/725 |
| 2013/0284374 A1 * | 10/2013 | Lubomirsky | H01L 21/67103 361/234 |
| 2017/0263486 A1 * | 9/2017 | Elliot | C04B 37/003 |
| 2018/0122680 A1 * | 5/2018 | Yang | H01J 37/32715 |
| 2020/0126773 A1 * | 4/2020 | Unno | H01L 21/67103 |

FOREIGN PATENT DOCUMENTS

| | | |
|---|---|---|
| JP | 2005-243988 A1 | 9/2005 |
| JP | 2006-270084 A1 | 10/2006 |
| JP | 2006-344766 A1 | 12/2006 |
| JP | 2009-256789 A1 | 11/2009 |
| JP | 5324627 B2 | 10/2013 |
| JP | 2015-517224 A1 | 6/2015 |

OTHER PUBLICATIONS

International Search Report and Written Opinion (Application No. PCT/JP2019/005962) dated May 21, 2019.

Taiwanese Office Action, Taiwanese Application No. 108105975, dated Jul. 26, 2022 (5 pages).

* cited by examiner

ELECTROSTATIC-CHUCK HEATER

BACKGROUND OF THE INVENTION

1. Field of the Invention

The present invention relates to an electrostatic-chuck heater.

2. Description of the Related Art

Hitherto, wafer-supporting tables that support wafers have been known. For example, referring to FIG. 10, a wafer-supporting table 110 disclosed by PTL 1 includes a ceramic base 120 on which a wafer W is to be mounted, a hollow shaft 140 attached to a side of the ceramic base 120 that is opposite a side on which the wafer W is to be mounted, and a through-hole 142 extending from the lower end of the peripheral wall of the hollow shaft 140 through to an outer peripheral side face of the ceramic base 120. Purge gas supplied into the through-hole 142 is ejected from the outer peripheral side face of the ceramic base 120, passes through a space between the wafer W and a ring 130, and goes out of the space upward (see a one-dot-chain-line arrow in FIG. 10). In a process of forming a thin film on the upper surface of the wafer W by CVD, the purge gas prevents the formation of the thin film at the edge of the wafer W.

CITATION LIST

Patent Literature

PTL 1: JP No. 5324627 B

SUMMARY OF THE INVENTION

The purge gas flowing along the back surface of the wafer W at the outer peripheral edge of the wafer W flows from the outer side toward the inner side. Therefore, as illustrated in FIG. 11, a conductive film F formed on the upper surface of the wafer W by CVD may extend into a gap between a wafer-contact surface 122 of the ceramic base 120 and the wafer W. If the conductive film F extends into the gap between the wafer-contact surface 122 and the wafer W on the wafer-supporting table 110 having a function of attracting and holding the wafer W to the ceramic base 120 with a Johnsen-Rahbek force, the force of attraction may be reduced. Specifically, when a wafer W having undergone a CVD process is dismounted and is exchanged for a fresh wafer W, the fresh wafer W has the same potential as the wafer-contact surface 122 of the ceramic base 120 with the presence of the conductive film F. In such a case, only an unsatisfactory level of Johnsen-Rahbek force may be generated. Consequently, the force of attraction is reduced.

The present invention is to solve the above problem, and a main object of the present invention is to achieve stable chucking of a wafer.

An electrostatic-chuck heater according to the present invention is
a Johnsen-Rahbek electrostatic-chuck heater to be used in a process of forming a conductive film on a wafer and includes:
a disc-shaped ceramic base having on one side a wafer-mounting surface on which the wafer is to be mounted, the ceramic base including an electrostatic electrode and a heating resistor;
a hollow shaft attached to a side of the ceramic base that is opposite the side having the wafer-mounting surface;
a protruding ring provided on the wafer-mounting surface and having an outside diameter smaller than a diameter of the wafer; and
a through-hole extending in a peripheral wall of the hollow shaft from a lower end through to an area of the wafer-mounting surface that is on an inner side with respect to the protruding ring, the through-hole allowing gas to be supplied from the lower end of the hollow shaft into a below-wafer space enclosed by the wafer-mounting surface, the protruding ring, and the wafer mounted on the wafer-mounting surface.

The above electrostatic-chuck heater is used in the process of forming a conductive film on the surface of the wafer mounted over the protruding ring. In this process, the conductive film also adheres to an area of the wafer-mounting surface that is on the outer side with respect to the protruding ring. Note that the outside diameter of the protruding ring is smaller than the diameter of the wafer. Therefore, in plan view, the protruding ring is covered with the wafer. Hence, the conductive film is less likely to adhere to the upper surface of the protruding ring that is in contact with the back surface of the wafer. Furthermore, since the gas is supplied into the below-wafer space, a component that is to form the conductive film is less likely to flow into the gap between the protruding ring and the wafer. In this respect as well, the conductive film is less likely to adhere to the upper surface of the protruding ring. Therefore, when the formation of a conductive film on a wafer is completed and a fresh wafer is mounted over the upper surface of the protruding ring, the wafer comes into close contact with the upper surface of the protruding ring, to which no conductive film has adhered. Therefore, the wafer-chucking force, i.e. the Johnsen-Rahbek force, is maintained at the initial level. Accordingly, wafers can each be chucked stably throughout repeated processing.

In the electrostatic-chuck heater according to the present invention, the wafer-mounting surface may have a plurality of embossed parts provided in the area on the inner side with respect to the protruding ring and that are to come into contact with the wafer. In such a case, the area of contact between the wafer and the ceramic base is increased by the areas of the embossed parts. Therefore, the wafer-chucking force is increased. Accordingly, the wafer can be chucked more stably.

In the electrostatic-chuck heater according to the present invention, the protruding ring may have a slit through which the inner side and an outer side with respect to the protruding ring communicate with each other. In such a case, the gas in the below-wafer space flows from the center of the wafer toward the outer periphery. Such a flow makes it more difficult for the component that is to form the conductive film to flow into the gap between the protruding ring and the wafer.

In the electrostatic-chuck heater according to the present invention, an opening of the through-hole in the wafer-mounting surface may be provided as a plurality of small holes having smaller diameters than the through-hole. In such a case, the gas flowing through the through-hole is dispersed before striking the back surface of the wafer. Therefore, the wafer can be chucked more stably and the reduction in the temperature of the wafer that is caused by the gas can be made smaller than in a case where the gas strikes the back surface of the wafer at one point.

In the electrostatic-chuck heater according to the present invention, a force with which the gas supplied into the below-wafer space pushes up the wafer may be smaller than a sum of a wafer-chucking force generated by energizing the electrostatic electrode and a force with which atmosphere above the wafer pushes down the wafer. In such a case, the wafer can be prevented from being lifted up by the gas supplied into the below-wafer space.

In the electrostatic-chuck heater according to the present invention, the electrostatic electrode may be used as a plasma electrode. If a high frequency is applied to the electrostatic electrode, the electrostatic electrode can be used as a plasma electrode. In such a case, the film can be formed by plasma CVD.

The electrostatic-chuck heater according to the present invention may further include a ring-shaped groove and/or a plurality of radially arranged grooves on the inner side with respect to the protruding ring. If such grooves are provided on the inner side with respect to the protruding ring, the flow of the gas in the below-wafer space is evened out. Therefore, the component that is to form the conductive film is much less likely to flow into the gap between the protruding ring and the wafer. Note that the grooves may each have a depth of 0.1 mm or smaller and a width of 5 mm or smaller.

In the electrostatic-chuck heater according to the present invention, the protruding ring may have a surface roughness Ra of 1 µm or greater. In such a case, the gas in the below-wafer space flows from the center of the wafer over the rough upper surface of the protruding ring to the outer periphery. Such a flow of the gas makes it more difficult for the component that is to form the conductive film to flow into the gap between the protruding ring and the wafer.

In the electrostatic-chuck heater according to the present invention, the through-hole may have openings in the area of the wafer-mounting surface that is on the inner side with respect to the protruding ring and both in a central part and in an outer peripheral part, respectively, of the wafer-mounting surface. In such a case, the gas is supplied into the below-wafer space from the openings that are positioned in the outer peripheral part of the wafer-mounting surface, i.e. the openings near the protruding ring. Therefore, the component that is to form the conductive film is more easily prevented from flowing into the gap between the protruding ring and the wafer.

BRIEF DESCRIPTION OF THE DRAWINGS

FIG. 5 is a plan view of an electrostatic-chuck heater including a chucking ring 22 having slits 22a.

DETAILED DESCRIPTION OF THE INVENTION

Figure 1:
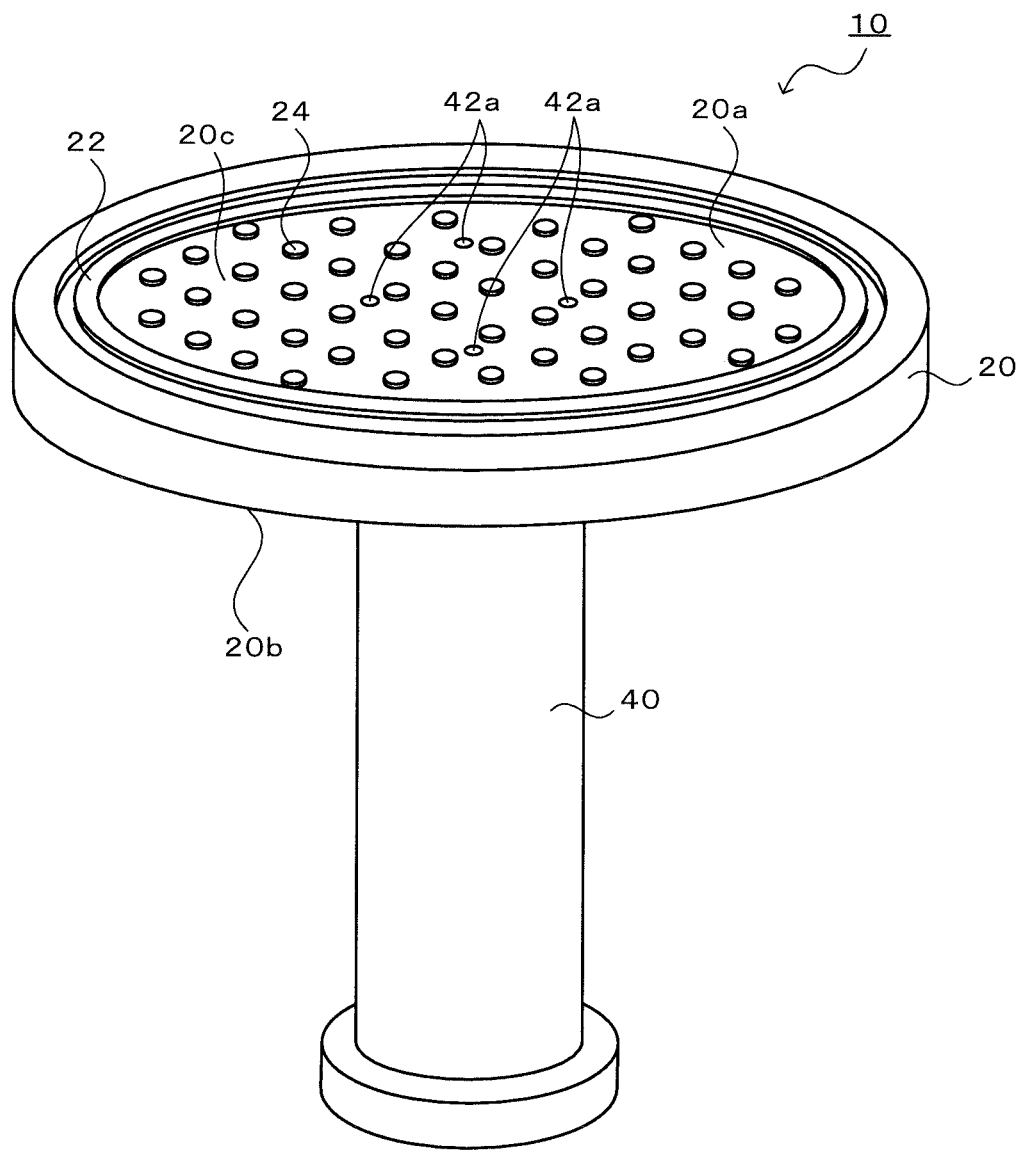
FIG. 1 is a perspective view of an electrostatic-chuck heater 10.
Figure 2:
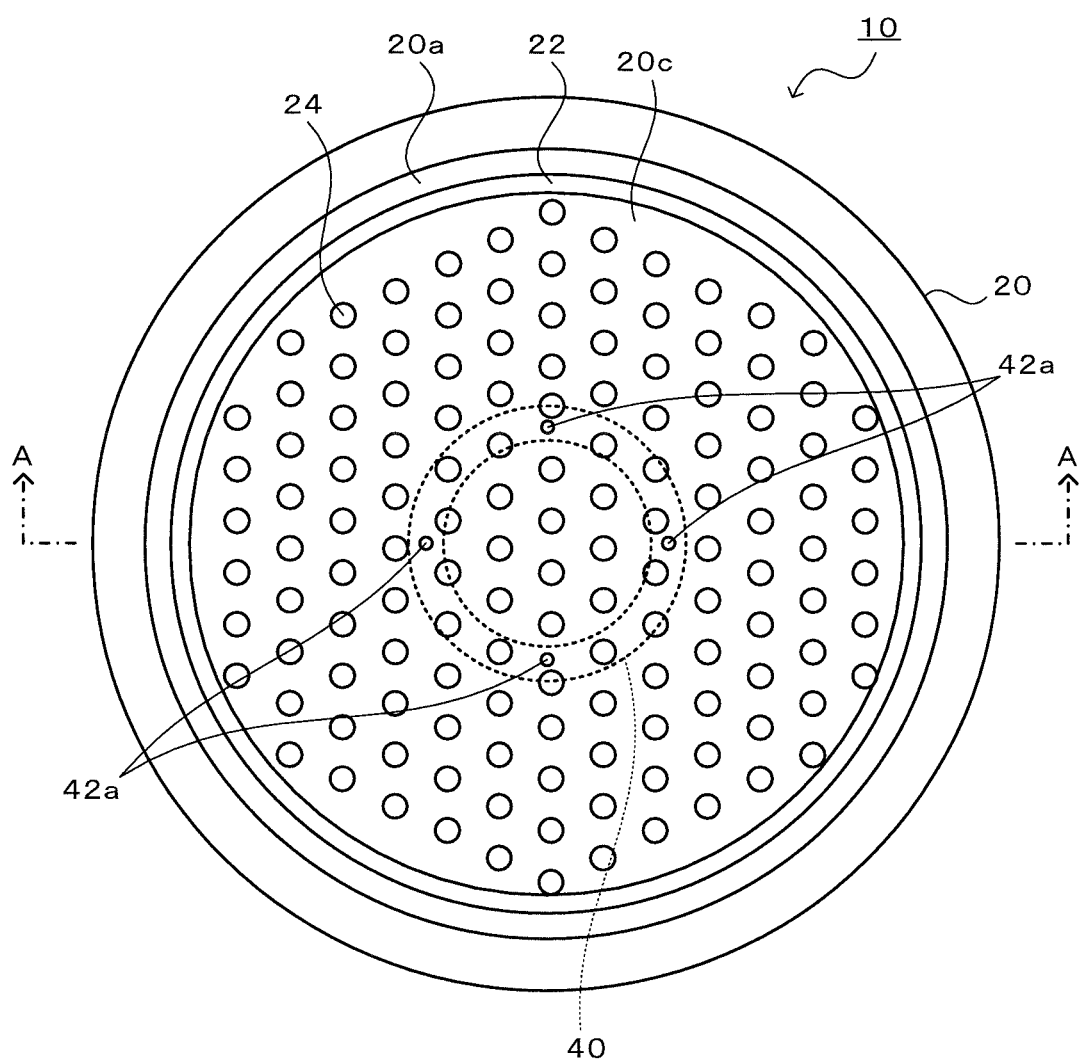
FIG. 2 is a plan view of the electrostatic-chuck heater 10.
Figure 3:
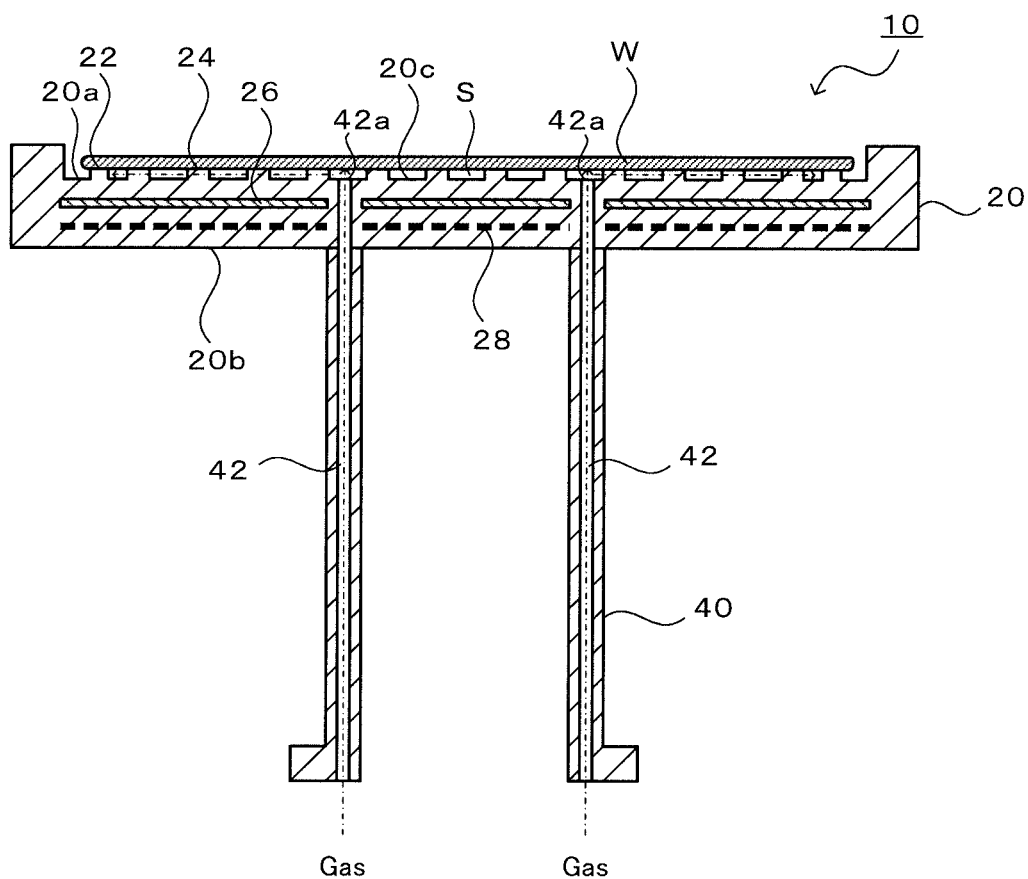
FIG. 3 is a sectional view taken along line A-A illustrated in FIG. 2.

A preferred embodiment of the present invention will now be described with reference to the drawings. FIG. 1 is a perspective view of an electrostatic-chuck heater 10. FIG. 2 is a plan view of the electrostatic-chuck heater 10. FIG. 3 is a sectional view taken along line A-A illustrated in FIG. 2.

The electrostatic-chuck heater 10 is used in a process of forming a conductive film on a wafer W by CVD or the like and includes a ceramic base 20 and a hollow shaft 40.

The ceramic base 20 is a disc made of aluminum nitride. The diameter of the ceramic base 20 is not specifically limited and may be, for example, about 300 mm. The ceramic base 20 has a wafer-mounting surface 20a on which the wafer W is to be mounted, and a back surface 20b that is opposite the wafer-mounting surface 20a. The ceramic base 20 has a chucking ring 22 on the wafer-mounting surface 20a. The chucking ring 22 is a protruding ring concentric with the ceramic base 20. The chucking ring 22 is integrated with the ceramic base 20 and has an outside diameter smaller than the diameter of the wafer W. An in-ring area 20c of the wafer-mounting surface 20a that is surrounded by the chucking ring 22 is provided with a number of embossed parts 24 each having a flat round columnar shape and being arranged at intervals. The embossed parts 24 in combination with the chucking ring 22 support the wafer W by coming into contact with the back surface of the wafer W.

The ceramic base 20 is provided with an electrostatic electrode 26 and a heating resistor 28 embedded therein. The electrostatic electrode 26 is a circular thin-film electrode having a slightly smaller diameter than the ceramic base 20 and is made of, for example, thin metal wires woven into a mesh sheet. The electrostatic electrode 26 is connected to a power-feeding bar, not illustrated. The power-feeding bar is connected to an external power source, not illustrated, through a space inside the hollow shaft 40. When a voltage is applied to the electrostatic electrode 26 from the external power source, the wafer W mounted on the wafer-mounting surface 20a is suctioned and retained. The suction force thus generated is a Johnsen-Rahbek force, because the volume resistivity of aluminum nitride forming the ceramic base 20 is $1 \times 10^8$ to $1 \times 10^{13}$ Ωcm. The heating resistor 28 is a coil of conductive wire extending in a single continuous line over the entirety of the ceramic base 20. Two ends of the heating resistor 28 are each connected to a power-feeding bar, not illustrated. The power-feeding bar is connected to a heater power source, not illustrated, through the space inside the hollow shaft 40. The heating resistor 28 generates heat when supplied with power from the heater power source, thereby heating the wafer W mounted on the wafer-mounting surface 20a. The heating resistor 28 is not limited to a coil and may be, for example, a ribbon (a long, narrow, thin strip) or a mesh.

The hollow shaft 40 is made of aluminum nitride, as with the ceramic base 20. The upper end face of the hollow shaft 40 is attached to the back surface 20b of the ceramic base 20 by solid-state bonding or diffusion bonding. The peripheral wall of the hollow shaft 40 has four through-holes 42 arranged at regular intervals in the circumferential direction. The through-holes 42 each extend vertically from the lower end of the hollow shaft 40 through to the in-ring area 20c of the ceramic base 20. The through-holes 42 are open at respective positions in the in-ring area 20c that are straightly above the peripheral wall of the hollow shaft 40. Openings 42a of the through-holes 42 are at respective positions in the in-ring area 20c that do not interfere with the embossed parts 24. A gas source, not illustrated, is connected to the through-holes 42.

Now, an exemplary usage of the electrostatic-chuck heater 10 will be described. The electrostatic-chuck heater 10 is put into a CVD chamber, not illustrated, and a wafer W is mounted over the plurality of embossed parts 24 and the chucking ring 22 provided on the wafer-mounting surface 20a. In this step, a space enclosed by the wafer-mounting surface 20a, the chucking ring 22, and the wafer W is denoted as a below-wafer space S. When a voltage is applied to the electrostatic electrode 26, the wafer W is suctioned and retained with a Johnsen-Rahbek force. Furthermore, the temperature of the wafer W is obtained from a detection signal generated by a thermocouple, not illustrated, and the voltage to be applied to the heating resistor 28 is controlled to make the temperature of the wafer W a target temperature. Furthermore, gas is supplied into the through-holes 42 from the gas source. The gas supplied into the through-holes 42 flows into the below-wafer space S from the openings 42a provided in the in-ring area 20c, and advances through the embossed parts 24 toward the outer periphery (see one-dot chain lines in FIG. 3). In this state, a conductive film F (see FIG. 4) is formed on the upper surface of the wafer W by CVD.

In the above process, the force with which the gas supplied into the below-wafer space S pushes up the wafer W is set to a value smaller than the sum of the wafer-chucking force generated by energizing the electrostatic electrode 26 and the force with which the atmosphere above the wafer W pushes down the wafer W. Therefore, the wafer W can be prevented from being lifted up by the gas supplied into the below-wafer space S.

Figure 4:
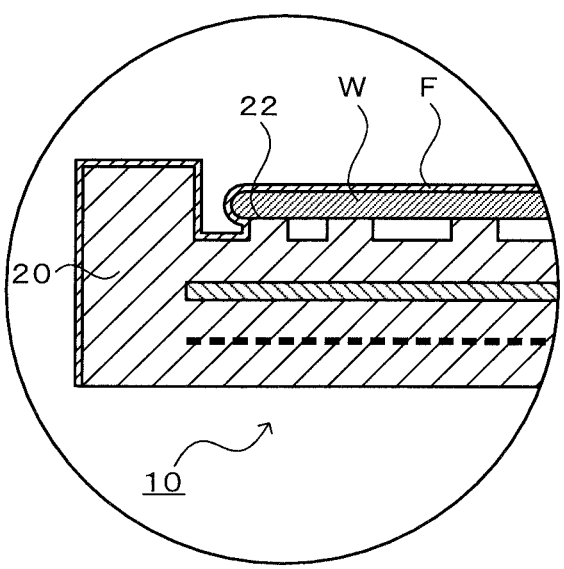
FIG. 4 is a sectional view of part of the electrostatic-chuck heater 10 in a state after the formation of a conductive film F.

When a conductive film F is formed on the surface of the wafer W, the conductive film F also adheres to part of the surface of the ceramic base 20 that is on the outer side with respect to the chucking ring 22 (see FIG. 4). Note that the outside diameter of the chucking ring 22 is smaller than the diameter of the wafer W. Therefore, in plan view, the chucking ring 22 is covered with the wafer W. Hence, the conductive film F is less likely to adhere to the upper surface of the chucking ring 22 that is in contact with the back surface of the wafer W. Furthermore, since the gas is supplied into the below-wafer space S, a component that is to form the conductive film F is less likely to flow into the gap between the chucking ring 22 and the wafer W. In this respect as well, the conductive film F is less likely to adhere to the upper surface of the chucking ring 22.

In the process of forming a conductive film F on the surface of a wafer W by using the electrostatic-chuck heater 10 described above, the conductive film F is prevented from adhering to the upper surface of the chucking ring 22. Therefore, when the formation of a conductive film F on a wafer W is completed and a fresh wafer W is mounted over the upper surface of the chucking ring 22, the fresh wafer W comes into close contact with the upper surface of the chucking ring 22, to which no conductive film F has adhered. Therefore, the Johnsen-Rahbek force is maintained at the initial level. Accordingly, wafers W can each be chucked stably throughout repeated processing.

If the conductive film F adheres to the upper surface of the chucking ring 22, cleaning is necessary for removing the conductive film F adhered to the upper surface of the chucking ring 22. Such cleaning lowers the production efficiency. In the present embodiment, the conductive film F does not adhere to the upper surface of the chucking ring 22. Therefore, the above cleaning is not necessary, and the production efficiency is improved.

Furthermore, the in-ring area 20c has the large number of embossed parts 24 that are to come into contact with the wafer W. Therefore, the area of contact between the wafer W and the ceramic base 20 is increased by the areas of the embossed parts 24. Accordingly, the wafer-chucking force is increased. Thus, the wafer W can be chucked more stably.

Needless to say, the present invention is not limited to the above embodiment in any way and can be embodied in various ways within the technical scope of the present invention.

For example, in the above embodiment, the upper surface of the chucking ring 22 may have a surface roughness Ra of 1 μm or greater. In such a case, the gas in the below-wafer space S flows from the center of the wafer W over the rough upper surface of the chucking ring 22 to the outer periphery. Such a flow of the gas makes it more difficult for the component that is to form the conductive film F to flow into the gap between the chucking ring 22 and the wafer W.

Figure 5:
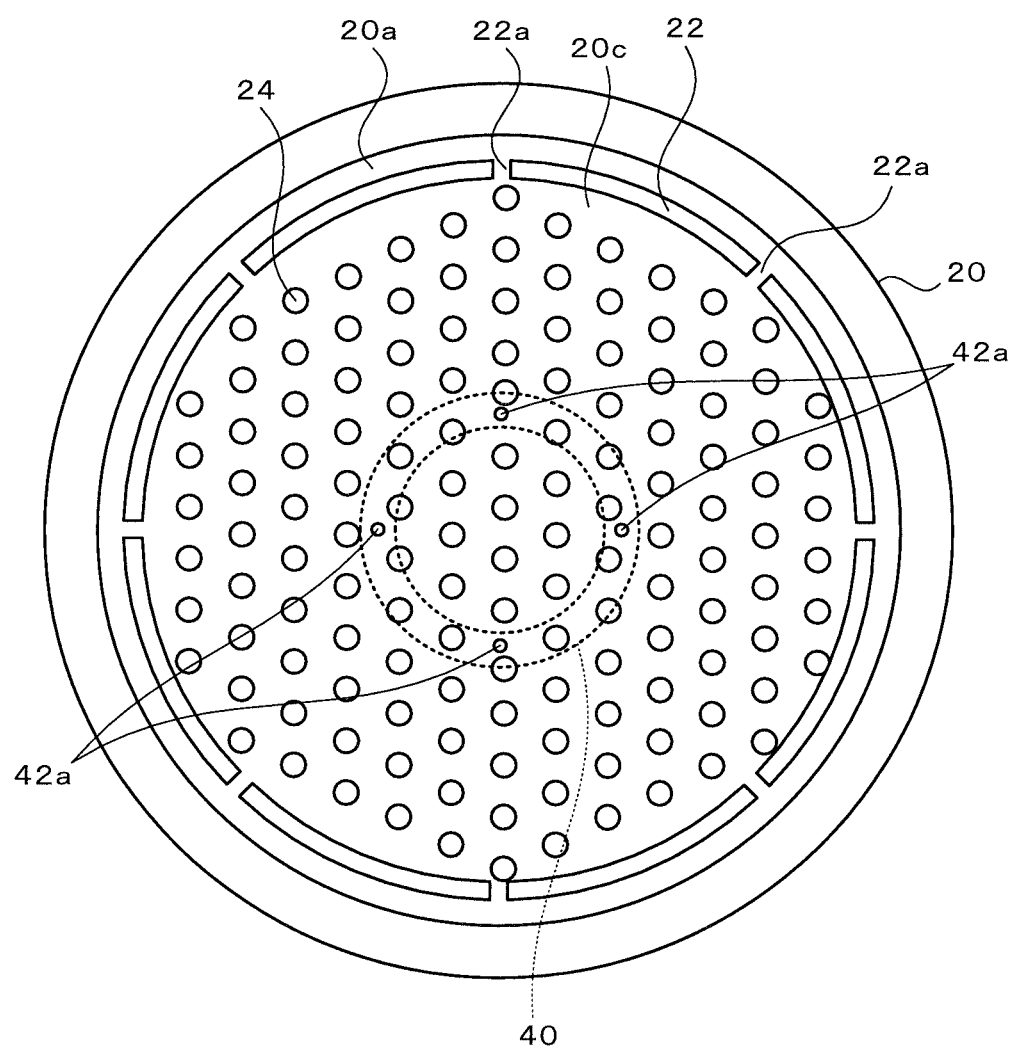

In the above embodiment, as illustrated in FIG. 5, the chucking ring 22 may have slits 22a through which the inner side and the outer side of the chucking ring 22 communicate with each other. In FIG. 5, elements that are the same as those described in the above embodiment are denoted by the corresponding ones of the reference numerals. While FIG. 5 illustrates a case where the chucking ring 22 has eight slits 22a provided at regular intervals in the circumferential direction thereof, the number of slits 22a is not specifically limited. In such a case, the gas in the below-wafer space S becomes more likely to flow from the center of the wafer W toward the outer periphery of the chucking ring 22. Such a flow makes it more difficult for the component that is to form the conductive film F to flow into the gap between the chucking ring 22 and the wafer W.

Figure 6:
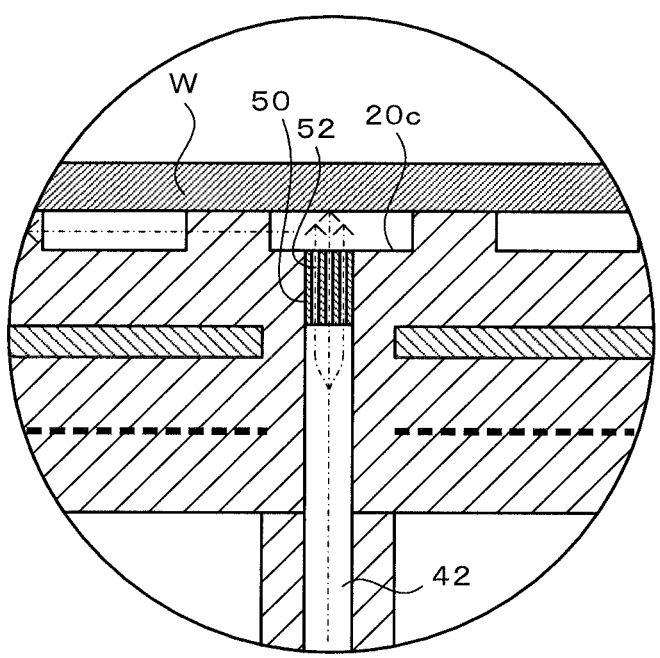
FIG. 6 is a sectional view of part of an electrostatic-chuck heater having a through-hole 42 provided with a plug 50.

In the above embodiment, as illustrated in FIG. 6, the through-holes 42 in the wafer-mounting surface 20a are each provided with a plug 50 fitted at the opening thereof, the plug 50 having a plurality of small holes 52 whose diameters are smaller than the diameter of the through-hole 42. In such a case, the opening of the through-hole 42 is provided as the plurality of small holes 52. Accordingly, the gas flowing through the through-hole 42 is dispersed into the small holes 52 before striking the back surface of the wafer W. Therefore, the wafer W can be chucked more stably and the reduction in the temperature of the wafer W that is caused by the gas can be made smaller than in a case where the gas concentratedly strikes the back surface of the wafer W.

Figure 7:
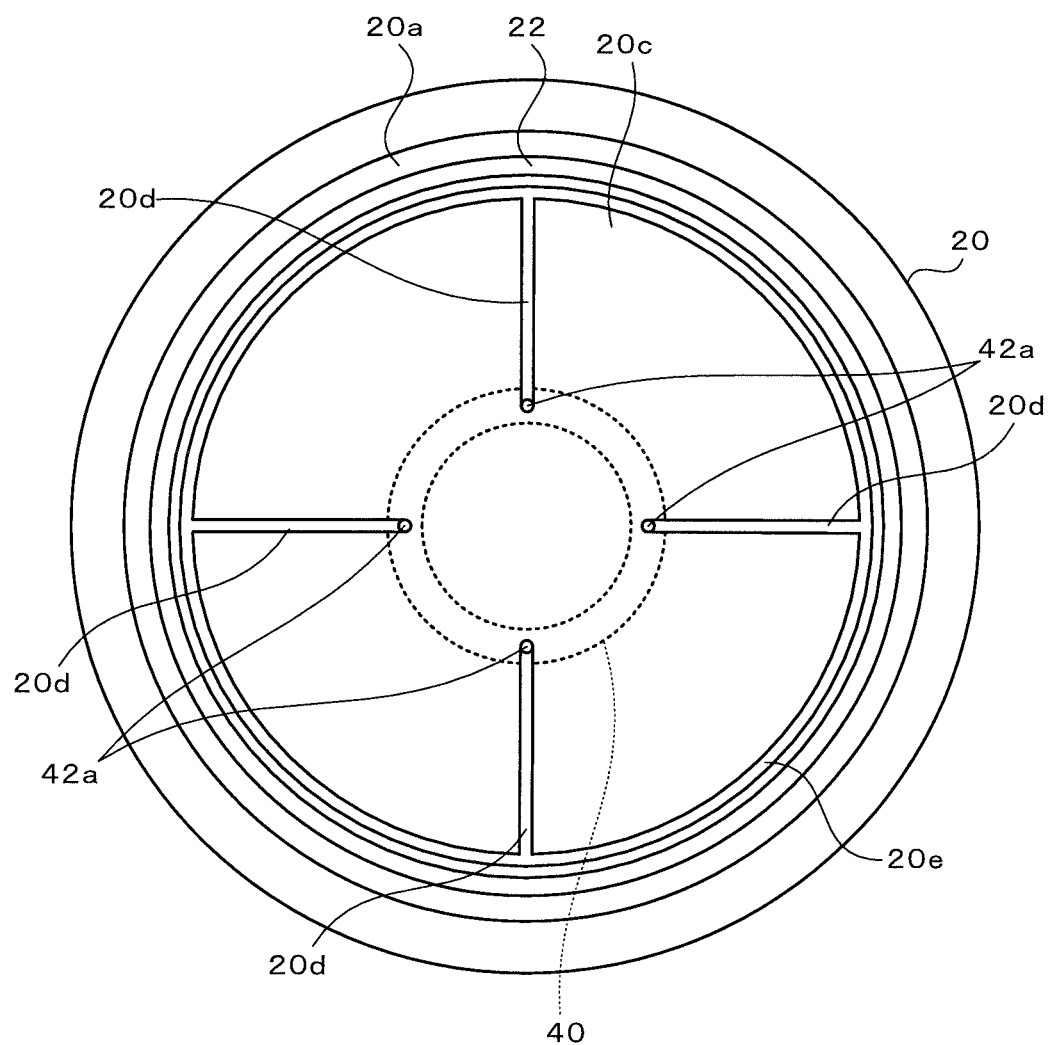
FIG. 7 is a plan view of an electrostatic-chuck heater having grooves 20d and 20e in an in-ring area 20c.

In the above embodiment, as illustrated in FIG. 7, four radially extending grooves 20d connected to the openings 42a of the respective through-holes 42 and a ring-shaped groove 20e connected to the outer ends of the respective grooves 20d may be provided in the in-ring area 20c of the ceramic base 20 (the area of the wafer-mounting surface 20a that is on the inner side of the chucking ring 22). In FIG. 7, elements that are the same as those described in the above embodiment are denoted by the corresponding ones of the reference numerals, but the embossed parts 24 are not illustrated. In such a case, the flow of the gas in the below-wafer space S is more likely to be evened out with the presence of the grooves 20d and 20e. Therefore, the component that is to form the conductive film F is much less likely to flow into the gap between the chucking ring 22 and the wafer W. Note that the grooves 20*d* and 20*e* may each have a depth of 0.1 mm or smaller and a width of 5 mm or smaller.

Figure 8:
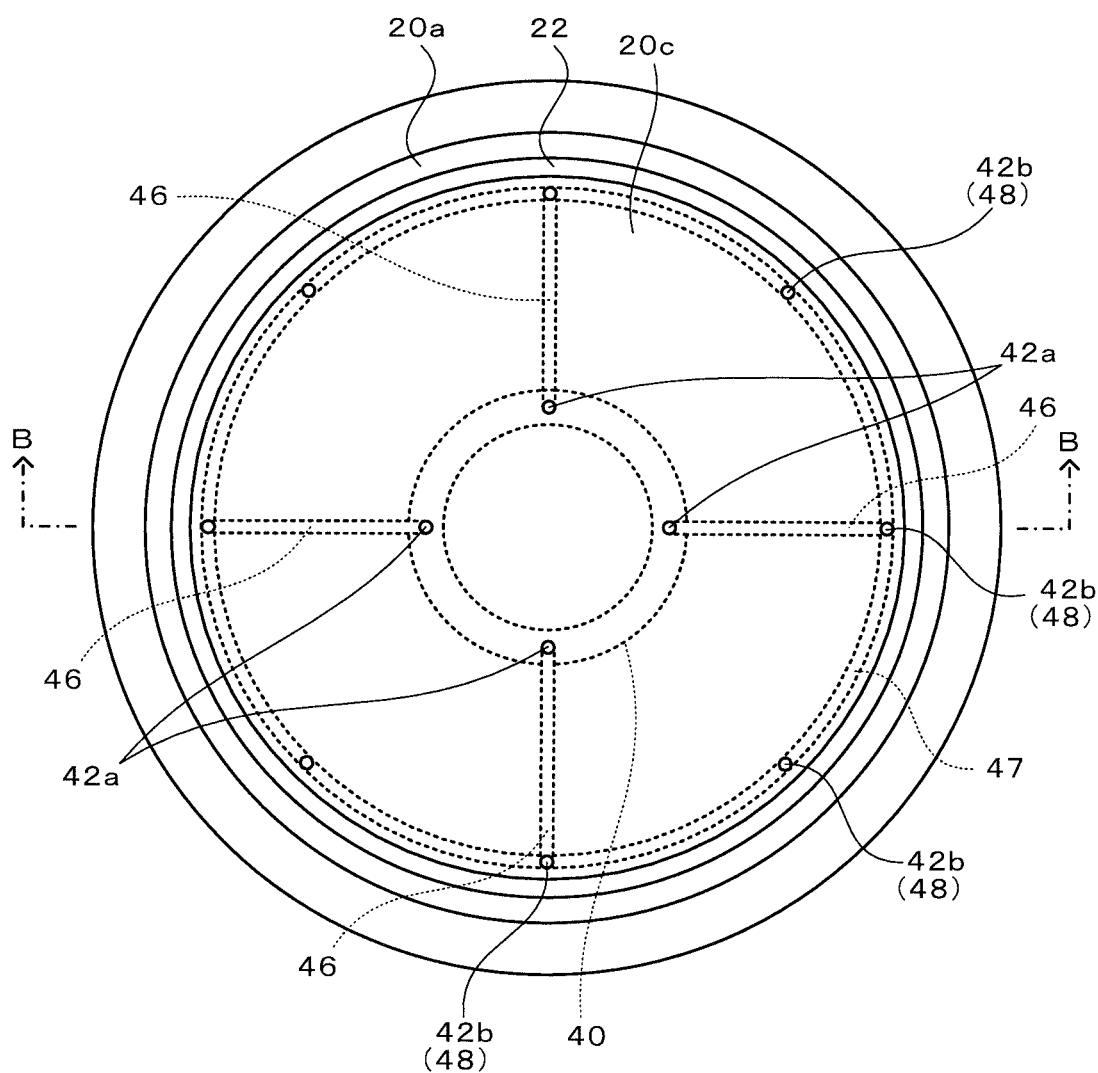
FIG. 8 is a plan view of an electrostatic-chuck heater having through-holes 42 each having openings 42a and 42b.
Figure 9:
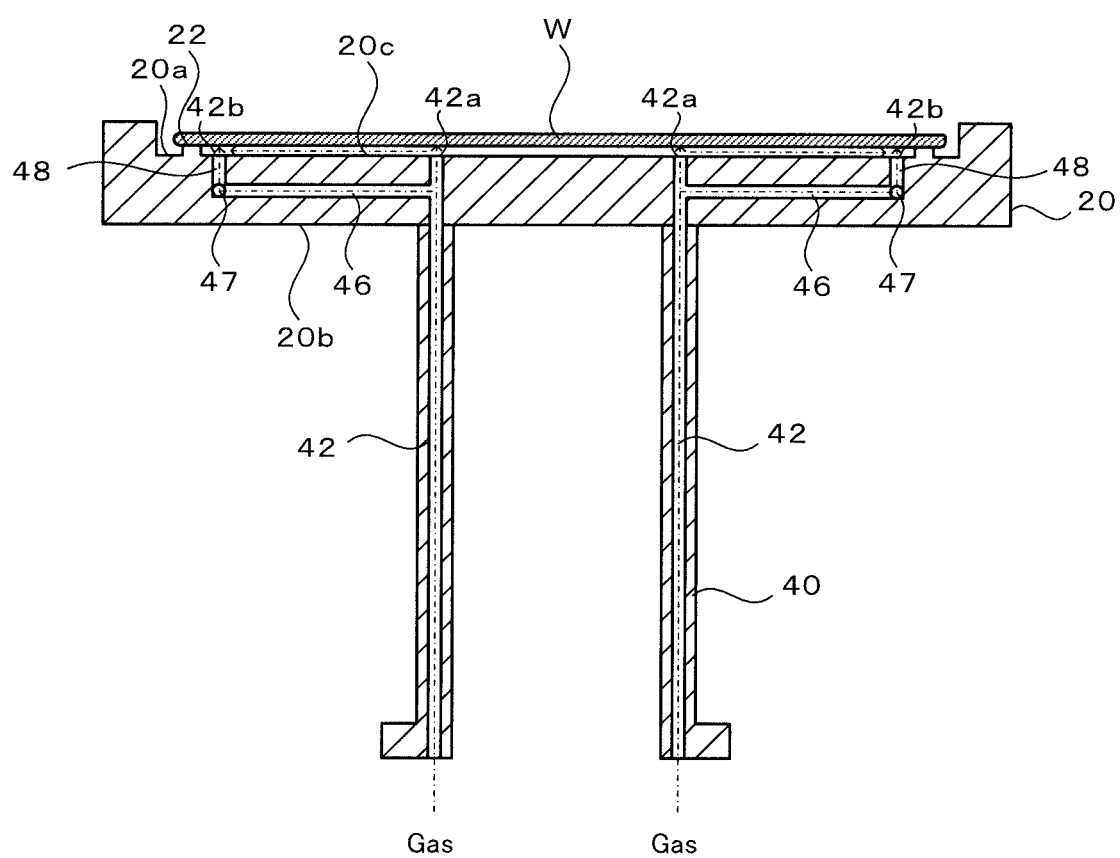
FIG. 9 is a sectional view taken along line B-B illustrated in FIG. 8.
Figure 10:
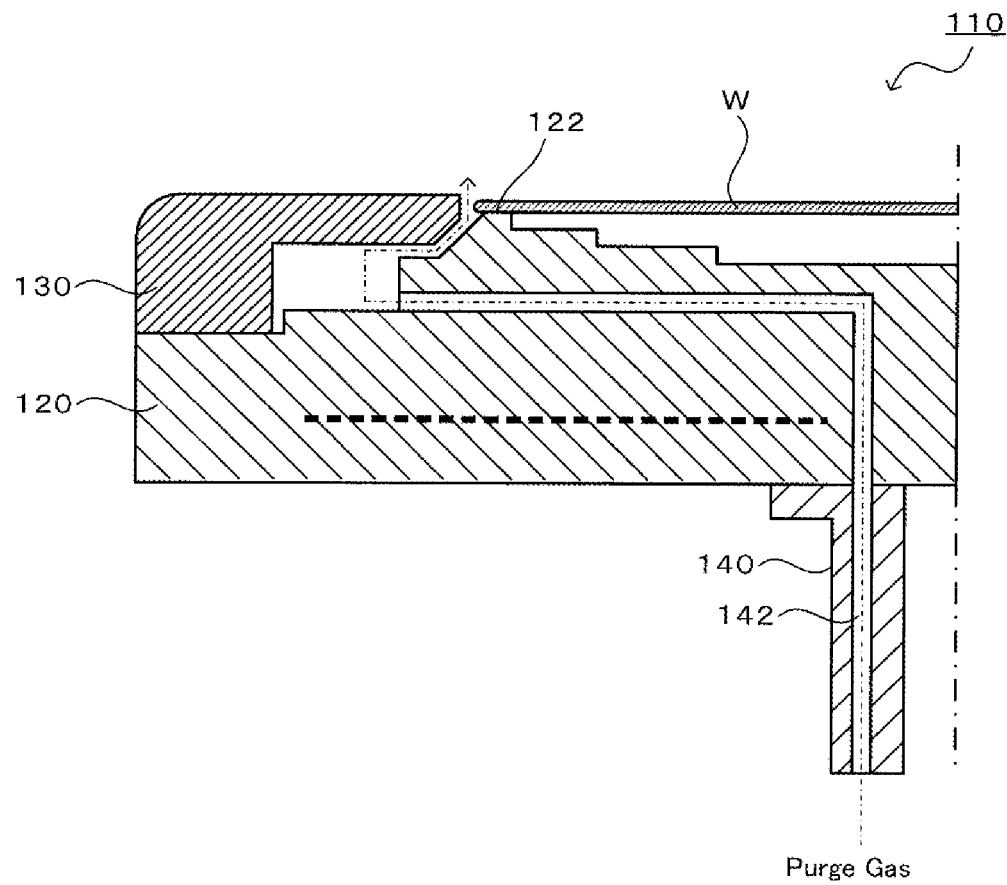
FIG. 10 is a sectional view of a known wafer-mounting table 110.
Figure 11:
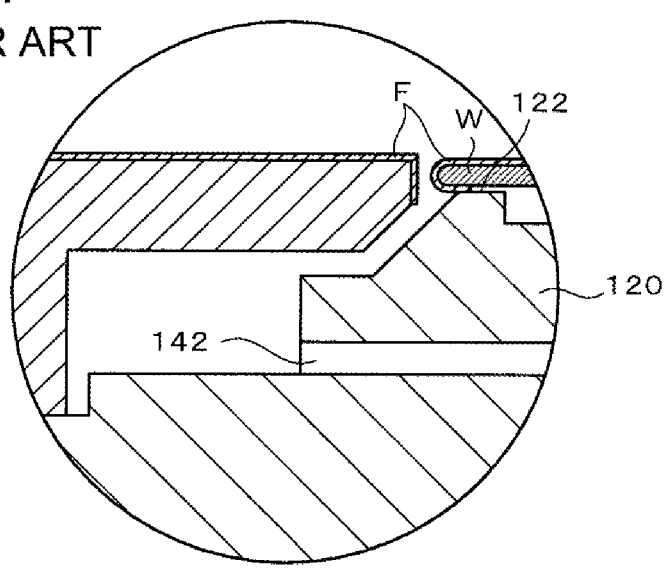
FIG. 11 is a sectional view of part of the wafer-mounting table 110 in a state after the formation of a conductive film F.

In the above embodiment, as illustrated in FIGS. 8 and 9, the through-holes 42 may be provided with branches 46 extending in a radial direction inside the ceramic base 20. In FIGS. 8 and 9, elements that are the same as those described in the above embodiment are denoted by the corresponding ones of the reference numerals, but the embossed parts 24 are not illustrated. The branches 46 communicate with, at the outer ends thereof, a circular hole 47 provided concentrically with the ceramic base 20. The outside diameter of the circular hole 47 is slightly smaller than the inside diameter of the chucking ring 22. The circular hole 47 communicates with a plurality (eight in this case) of vertical holes 48 provided at regular intervals in the circumferential direction. The vertical holes 48 are open in the in-ring area 20*c* and adjacent to the chucking ring 22. Accordingly, the through-holes 42 each have, in the in-ring area 20*c*, both an opening 42*a* positioned in a central part of the wafer-mounting surface 20*a* and an opening 42*b* (the opening of the vertical hole 48) positioned in an outer peripheral part of the wafer-mounting surface 20*a*. In such a case, the gas is supplied into the below-wafer space S from the openings 42*b* positioned near the chucking ring 22. Therefore, the component that is to form the conductive film F is more easily prevented from flowing into the gap between the chucking ring 22 and the wafer W.

The electrostatic electrode 26 according to the above embodiment may be used as a plasma electrode. If a high frequency is applied to the electrostatic electrode 26, the electrostatic electrode 26 can be used as a plasma electrode. In such a case, the film can be formed by plasma CVD.

While the above embodiment concerns a case where four through-holes 42 are provided in the peripheral wall of the hollow shaft 40 at regular intervals in the peripheral direction, the number of through-holes 42 is not limited to four and may be two, three, or five or more.

The present application claims priority from U.S. provisional Patent Application No. 62/647,965 filed Mar. 26, 2018, the entire contents of which are incorporated herein by reference.

What is claimed is:

1. A Johnsen-Rahbek electrostatic-chuck heater comprising:
   a disc-shaped ceramic base having on one side a wafer-mounting surface on which the wafer is to be mounted, the disc-shaped ceramic base including an electrostatic electrode and a heating resistor;
   a hollow ceramic shaft attached to a side of the disc-shaped ceramic base that is opposite to the one side having the wafer-mounting surface;
   a protruding ring provided on the wafer-mounting surface and having an outside diameter smaller than a diameter of the wafer;
   a through-hole extending in a peripheral wall of the hollow ceramic shaft from a lower end through to an opening formed in an area of the wafer-mounting surface that is on an inner side with respect to the protruding ring, the through-hole allowing gas to be supplied from the lower end of the hollow ceramic shaft into a below-wafer space enclosed by the wafer-mounting surface, the protruding ring, and the wafer mounted on the wafer-mounting surface; and
   wherein an area of the wafer mounting surface on an outer side with respect to the protruding ring is a surface without openings formed therein.

2. The Johnsen-Rahbek electrostatic-chuck heater according to claim 1,
   wherein the wafer-mounting surface has a plurality of embossed parts provided in the area on the inner side with respect to the protruding ring and that are to come into contact with the wafer.

3. The Johnsen-Rahbek electrostatic-chuck heater according to claim 1,
   wherein the protruding ring has a slit through which the inner side and an outer side with respect to the protruding ring communicate with each other.

4. The Johnsen-Rahbek electrostatic-chuck heater according to claim 1,
   wherein an opening of the through-hole in the wafer-mounting surface includes a plurality of small holes each having a smaller diameter than the through-hole.

5. The Johnsen-Rahbek electrostatic-chuck heater according to claim 1,
   wherein a force with which the gas supplied into the below-wafer space pushes up the wafer is smaller than a sum of a wafer-chucking force generated by energizing the electrostatic electrode and a force with which atmosphere above the wafer pushes down the wafer.

6. The Johnsen-Rahbek electrostatic-chuck heater according to claim 1,
   wherein the electrostatic electrode is also used as a plasma electrode.

7. The Johnsen-Rahbek electrostatic-chuck heater according to claim 1, further comprising:
   a ring-shaped groove and/or a plurality of radially arranged grooves on the inner side with respect to the protruding ring.

8. The Johnsen-Rahbek electrostatic-chuck heater according to claim 1,
   wherein the protruding ring has a surface roughness Ra of 1 µm or greater.

9. The Johnsen-Rahbek electrostatic-chuck heater according to claim 1,
   wherein the through-hole has openings in the area of the wafer-mounting surface that is on the inner side with respect to the protruding ring and both in a central part and in an outer peripheral part, respectively, of the wafer-mounting surface.

* * * * *